(12) United States Patent
Maeda et al.

(10) Patent No.: US 7,912,105 B2
(45) Date of Patent: Mar. 22, 2011

(54) VERTICAL CAVITY SURFACE EMITTING LASER

(75) Inventors: Osamu Maeda, Kanagawa (JP); Masaki Shiozaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/612,076

(22) Filed: Dec. 18, 2006

(65) Prior Publication Data
US 2007/0153865 A1 Jul. 5, 2007

(30) Foreign Application Priority Data

Dec. 19, 2005 (JP) ................................ P2005-364912

(51) Int. Cl.
*H01S 5/183* (2006.01)
(52) U.S. Cl. ........... 372/46.01; 372/46.013; 372/46.015; 372/50.124
(58) Field of Classification Search .............. 372/46.01, 372/46.013, 46.015, 50.124
See application file for complete search history.

(56) References Cited

U.S. PATENT DOCUMENTS

| 5,493,577 | A | * | 2/1996 | Choquette et al. | ....... | 372/46.013 |
| 5,594,751 | A | * | 1/1997 | Scott | ........ | 372/46.013 |
| 5,879,961 | A | | 3/1999 | Scott | | |
| 6,959,025 | B2 | * | 10/2005 | Jikutani et al. | ............ | 372/46.01 |
| 2007/0274361 | A1 | * | 11/2007 | Calvez et al. | ................ | 372/50.1 |

FOREIGN PATENT DOCUMENTS

| JP | 10-505465 | 5/1998 |
| JP | 2002-353562 | 12/2002 |
| JP | 2003-273459 | 9/2003 |
| JP | 2004-253408 | 9/2004 |
| JP | 2005-259951 | 9/2005 |
| WO | WO2005071808 | 4/2005 |

OTHER PUBLICATIONS

Japanese Patent Application Office Action corresponding to Japanese Serial No. 2005-364912 dated Mar. 2, 1010.

* cited by examiner

*Primary Examiner* — Minsun Harvey
*Assistant Examiner* — Michael Carter
(74) *Attorney, Agent, or Firm* — SNR Denton US LLP

(57) ABSTRACT

A VCSEL which can be easily manufactured and can selectively suppress only high-order transverse mode oscillation is provided. The VCSEL includes a resonator, a first current confinement layer, and a second current confinement layer. The resonator includes an active layer having a light emitting region, and a pair of first multilayer reflector and a second multilayer reflector provided with the active layer in between, and resonate is generated in a given wavelength. The first current confinement layer has a current injection region is a region corresponding to the light emitting region, and is formed at a region including an antinode of a standing wave. The second current confinement layer has a current injection region with a diameter smaller than a diameter of the first current injection region and is formed at a region including a node standing wave.

11 Claims, 6 Drawing Sheets

STANDING WAVE INTENSITY

VERTICAL CAVITY SURFACE EMITTING LASER

CROSS REFERENCES TO RELATED APPLICATIONS

The present invention contains subject matter related to Japanese Patent Application JP 2005-364912 filed in the Japanese Patent Office on Dec. 19, 2005, the entire contents of which being incorporated herein by reference.

BACKGROUND OF THE INVENTION

1. Field of the Invention

The present invention relates to a vertical cavity surface emitting laser (VCSEL) which has a laser light emitting region on the top face, particularly to a VCSEL which can be suitably applied to purposes necessitating light output in the low-order transverse mode.

2. Description of the Related Art

A VCSEL emits light in the direction perpendicular to the substrate unlike the existing edge-emitting laser diodes. In the VCSEL, many devices can be arranged in a state of a two dimensional array on the same substrate. Therefore, the VCSEL has recently attracted attention as a light source for a digital copy machine or a printer.

In the past, in the foregoing type of VCSEL, a pair of multilayer reflectors is formed over the semiconductor substrate, and an active layer becoming a light emitting region is provided between the pair of multilayer reflectors. In the region between one multilayer reflector and the active layer, in order to improve efficiency of current injection into the active layer and lower the threshold value current, a current confinement layer having a structure in which a current injection region is narrowed is provided. Further, an n-side electrode is provided on the bottom face side, and a p-side electrode is provided on the top face side. The p-side electrode is provided with a light emitting aperture to emit laser light. In the VCSEL, a current is confined by the current confinement layer, and then injected into the active layer where light is emitted. While the emitted light repeats reflection between the pair of multilayer reflectors, the light is emitted as laser light from the light emitting aperture of the p-side electrode.

It is known that in the foregoing VCSEL, while basic transverse mode oscillation is mainly generated in the central region in the laser light emitting region, high-order transverse mode oscillation is mainly generated in the outer edge region thereof. Therefore, there is a disadvantage that when the light emitting aperture is excessively widened to obtain high output of the VCSEL, laser light in the high-order transverse mode is also outputted at high output.

Therefore, to solve the foregoing disadvantage, many techniques for controlling transverse mode oscillation have been reported. For example, in Japanese Unexamined Patent Application Publication No. 2003-273459, a technique for providing a current confinement layer having a structure in which as the location of the current injection region becomes closer to the active layer, the diameter of the current injection region becomes larger has been disclosed.

SUMMARY OF THE INVENTION

In the technique of the foregoing Japanese Unexamined Patent Application Publication No. 2003-273459, the diameter of the current injection region on the active layer side is larger, and the current density becomes uniform in a wide range of the active layer. Thus, it is sure that the resistance of the device can be decreased, and the electrical power consumption can be lowered. However, to obtain such a shape of the current injection region, it is necessary to increase the thickness of the current confinement layer. The thick current confinement layer causes a light loss, and thus light output in the basic transverse mode is lowered.

As above, in the existing techniques, it has been difficult to easily manufacture a VCSEL device which can selectively prevent only the high-order transverse mode oscillation.

In view of the foregoing, in the invention, it is desirable to provide a VCSEL which can selectively prevent only the high-order transverse mode oscillation.

According to an embodiment of the invention, there is provided a VCSEL including: a resonator including an active layer having a light emitting region and a pair of a first multilayer reflector and a second multilayer reflector provided with the active layer in between, the resonator resonating in a given wavelength; a first current confinement layer having a first current injection region in a region corresponding to the light emitting region, and being formed at a region between the active layer and the first multilayer reflector, including an antinode of a standing wave formed in the resonator; and a second current confinement layer having a second current injection region with a diameter smaller than a diameter of the first current injection region and being formed at a region between the first current confinement layer and the first multilayer reflector or in the first multilayer reflector, including a node of the standing wave formed in the resonator.

In the VCSEL of the embodiment of the invention, the second current confinement layer with the thickness thinner than that of the first current confinement layer and with the diameter of the second current injection region smaller than that of the first current injection region is provided at the node of the standing wave. Therefore, in the second current confinement layer, a current is confined with giving no loss to light. Thereby, the diameter of the second current injection region can be decreased to the degree that the current density becomes almost uniform over the whole area of the second current injection region. The second current confinement layer is provided in a position farther from the active layer than the first current confinement layer. Therefore, when the diameter of the second current injection region is set to the size with which the current density becomes almost uniform over the whole area of the second current injection region, the current confined by the second current confinement layer is not concentrated on the outer edge of the first current injection region of the first current confinement layer, and the current is concentrated on the central portion of the first current injection region. In the result, it becomes possible to intensively inject the current into the central portion of the region corresponding to the first current injection region in the active layer (central portion of the light emitting region). Meanwhile, the first current confinement layer with the thickness thicker than that of the second current confinement layer and with the diameter of the first current injection region larger than that of the second current injection region is provided at the antinode of the standing wave. Therefore, in the first current confinement layer, a loss is given to light in the transverse mode with the order having a large gain in the portion corresponding to the outer edge of the first current injection region (outer edge of the light emitting region), and a loss is hardly given to light in the transverse mode with the order having a large gain in the portion corresponding to the central portion of the first current injection region (central portion of the light emitting region).

According to the VCSEL of the embodiment of the invention, the first current confinement layer having the first current injection region with the large diameter and the second current confinement layer having the second current injection region with the small diameter are provided in this order from the active layer side. Therefore, a current can be intensively injected into the central portion of the light emitting region of the active layer. Thereby, compared to a case that the current density is concentrated on the outer edge of the light emitting region, only oscillation in the high-order transverse mode having a large gain in the outer edge in the light emitting region can be selectively suppressed. Since the thin second current confinement layer is provided at the node of the standing wave, a loss is hardly given to light regardless of the diameter size of the second current injection region, and oscillation in the basic lateral mode having a large gain in the central portion of the light emitting region is hardly blocked.

Further, as described above, the second current confinement layer has a function to confine a current. Therefore, it is possible to relatively freely set the diameter size of the first current injection region of the first current confinement layer provided at the antinode of the standing wave. When the diameter size of the first current injection region is appropriately adjusted, it is possible that a loss is hardly given to the light in the basic lateral mode having a large gain in the central portion of the light emitting region, and a loss is selectively given to only the light in the high-order lateral mode having a large gain in the outer edge of the light emitting region.

As above, according to the VCSEL of the embodiment of the invention, only the high-order lateral mode oscillation can be selectively suppressed.

When the first current confinement layer has a thickness so that an integral value (area) of the standing wave intensity in the region corresponding to the first current confinement layer is 0.5 or more and smaller than 1.0 where an integral value (area) of the standing wave intensity in a region between two nodes located on the both sides of the antinode of the standing wave corresponding to the first current confinement layer is 1.0, a loss to the light in the basic lateral mode given from the first current confinement layer can be extremely small. Further, when the second current confinement layer has a thickness so that an integral value (area) the standing wave intensity in a region corresponding to the second current confinement layer is smaller than 0.1 where an integral value (area) of the standing wave intensity in a region between two nodes located on the both sides of the node of the standing wave corresponding to the second current confinement layer is 1.0, a light loss in the second current confinement layer can be extremely small. Thereby, it is possible to further improve the light output in the basic lateral mode while suppressing the oscillation in the high-order lateral mode.

Other and further objects, features and advantages of the invention will appear more fully from the following description.

DETAILED DESCRIPTION OF THE PREFERRED EMBODIMENT

Descriptions will be given of an embodiment of the invention in detail with reference to the drawings.

First Embodiment

Figure 1:
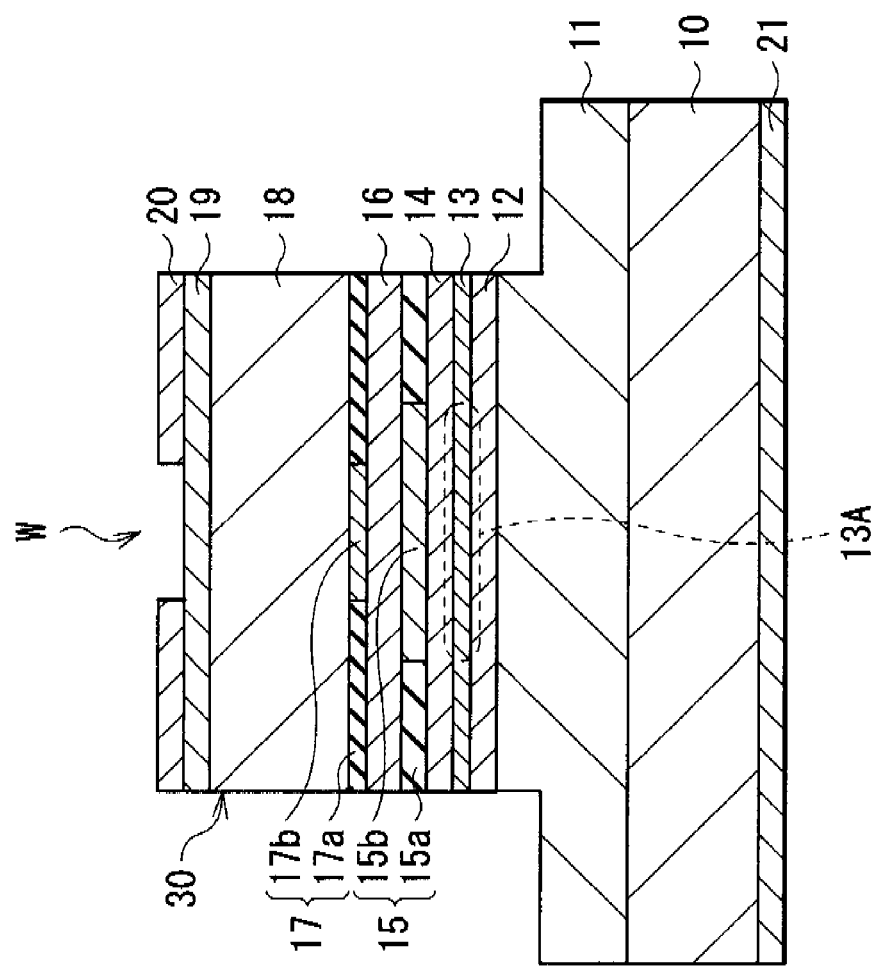
FIG. 1 shows a cross sectional structure of a VCSEL according to an embodiment of the invention.
Figures 2A, 2B:
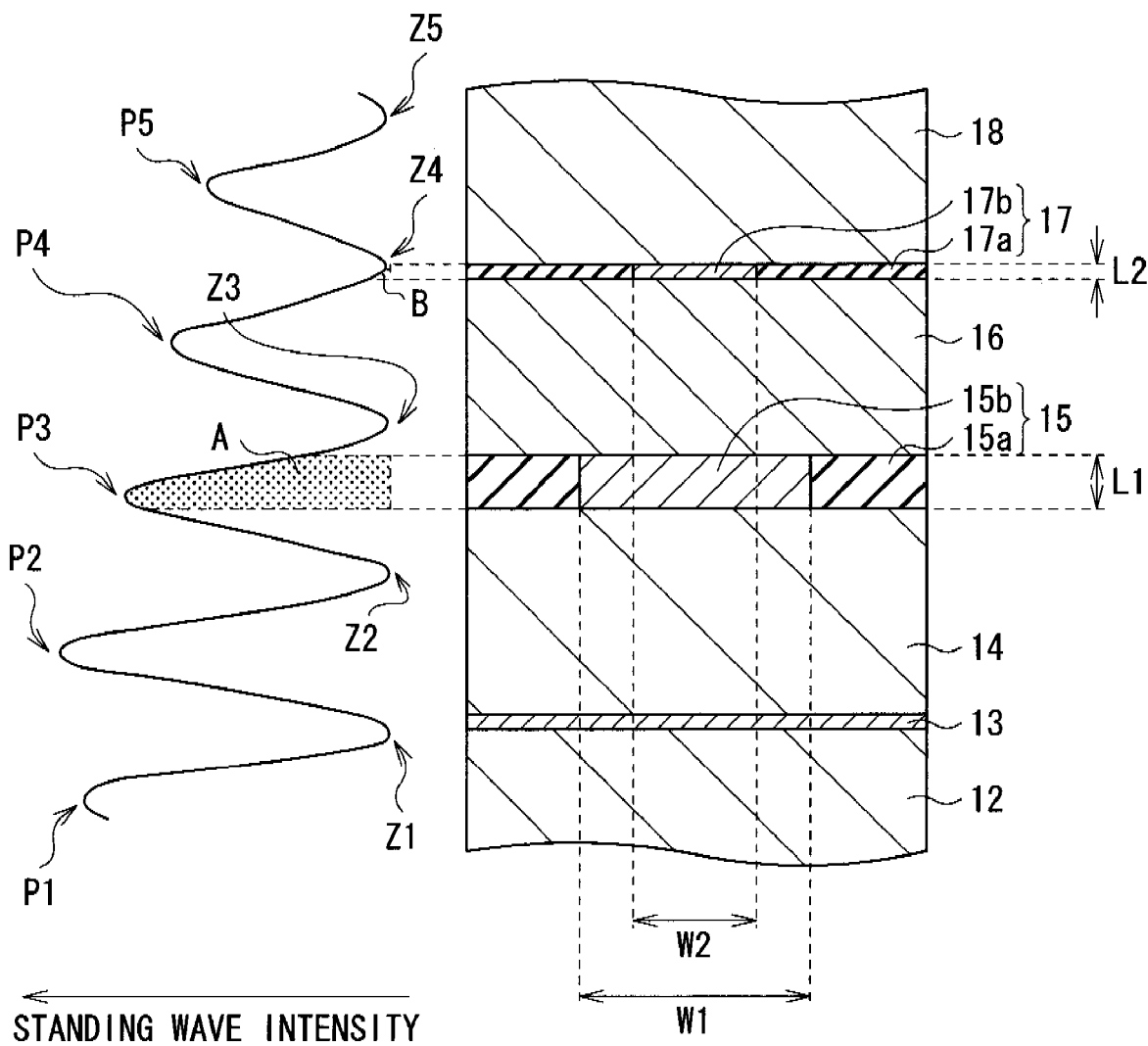
FIGS. 2A and 2B show a cross sectional structure showing an enlarged important part of the laser.

FIG. 1 shows a cross sectional structure of a VCSEL according to an embodiment of the invention. FIG. 2A shows standing wave intensity in a first current confinement layer 15 and a second current confinement layer 17 of the VCSEL of FIG. 1 and in the vicinity thereof. FIG. 2B shows an enlarged cross section of the first current confinement layer 15 and the second current confinement layer 17 of the VCSEL of FIG. 1 and the vicinity thereof. FIG. 1, FIG. 2A, and FIG. 2B show the views as a model, and thus the dimensions and the shapes thereof are different from actual dimensions and shapes.

The VCSEL includes a resonator in which an n-type DBR layer 11 (second multilayer reflector), an n-type guide layer 12, an active layer 13, a p-type guide layer 14, the first current confinement layer 15, a spacer layer 16, the second current confinement layer 17, a p-type DBR layer 18 (first multilayer reflector), and a p-type contact layer 19 are layered in this order on one face of a substrate 10. The upper section of the n-type DBR layer 11, the n-type guide layer 12, the active layer 13, the p-type guide layer 14, the first current confinement layer 15, the spacer layer 16, the second current confinement layer 17, the p-type DBR layer 18, and the p-type contact layer 19 are formed up to the p-type contact layer 19 and then are selectively etched from the top face, and thus become a columnar mesa 30. A p-side electrode 20 is formed on the p-type contact layer 19, and an n-side electrode 21 is formed on the rear face of the substrate 10.

The substrate 10, the n-type DBR layer 11, the n-type guide layer 12, the active layer 13, the p-type guide layer 14, the spacer layer 16, the p-type DBR layer 18, and the p-type contact layer 19 are respectively made of, for example, a GaAs (gallium-arsenic)-base compound semiconductor. The GaAs-base compound semiconductor includes a compound semiconductor containing at least gallium (Ga) of Group 3B elements in the short period periodic table and at least arsenic (As) of Group 5B elements in the short period periodic table.

The substrate 10 is made of, for example, n-type GaAs. The n-type DBR layer 11 includes a plurality of sets of a low-refractive index layer (not shown) and a high-refractive index layer (not shown), regarded these layers as one set, for example. The low-refractive index layer is formed from n-type $Al_{x1}Ga_{1-x1}As$ (0<x1<1) being $\lambda/4n_a$ ($\lambda$ is the oscillation wavelength, $n_a$ is the refractive index) thick, for example. The high-refractive index layer is formed from n-type $Al_{x2}Ga_{1-x2}As$ (0<x2<x1) being $\lambda/4n_b$ ($n_b$ is the refractive index) thick, for example. As an n-type impurity, for example, silicon (Si), selenium (Se) or the like can be cited.

The n-type guide layer 12 is made of, for example, $Al_{x3}Ga_{1-x3}As$ (0<x3<1). The active layer 13 is made of, for example, a GaAs-base material. In the active layer 13, the region opposed to a current injection region 11C-1 is a light emitting region, the central region of the light emitting region (light emitting central region 13A) is a region where basic transverse mode oscillation is mainly generated, and the region surrounding the light emitting central region 13A of the light emitting region is a region where high-order transverse mode oscillation is mainly generated. The p-type guide layer 14 is made of, for example, $Al_{x4}Ga_{1-x4}As$ ($0<x4<1$). Though the n-type guide layer 12, the active layer 13, and the p-type guide layer 14 desirably contain no impurity, but may contain a p-type impurity or an n-type impurity.

The spacer layer 16 is made of, for example, p-type $Al_{x5}Ga_{1-x5}As$ ($0<x5<1$). The p-type DBR layer 18 includes a plurality of sets of low-refractive index layer (not shown) and a high-refractive index layer (not shown), regarded these layers as one set, for example. The low-refractive index layer is formed from p-type $Al_{x6}Ga_{1-x6}As$ ($0<x6<1$) being $\lambda/4n_c$ ($\lambda$ is the oscillation wavelength, $n_c$ is the refractive index) thick, for example. The high-refractive index layer is formed from p-type $Al_{x7}Ga_{1-x7}As$ ($0<x7<x6$) being $\lambda/4n_d$ ($n_d$ is the refractive index) thick, for example. As a p-type impurity, zinc (Zn), magnesium (Mg), beryllium (Be) or the like can be cited.

The first current confinement layer 15 has a torus-shaped current confinement region 15a in the outer edge region thereof. The first current confinement layer 15 has a circular current injection region 15b (first current injection region) with the diameter of W1 (for example, 4 to 6 μm) in the central region thereof. The current injection region 15b is made of, for example, $Al_{x8}Ga_{1-x8}As$ ($x6<x8<1$). The current confinement region 15a contains $Al_2O_3$ (aluminum oxide) obtained by oxidizing high concentrated Al contained in the first current confinement layer 15 from the side surface of the mesa 30. That is, the first current confinement layer 15 has a function to confine a current.

The first current confinement layer 15 is formed at a region including an antinode located apart from an antinode in the active layer 13 by $m\lambda/2$ (m is an integer number of 1 or more, and $\lambda$ is the resonance wavelength). For example, as shown in FIGS. 2A and 2B, the first current confinement layer 15 is formed at a region between the active layer 13 and the p-type DBR layer 18, including antinode P3 as the third antinode from the active layer 13 side among antinodes (P1, P2, P3, P4, P5 and so on) of the standing wave with the same wavelength as the light emitting wavelength $\lambda$ formed in the resonator. The optical thickness L1 of the first current confinement layer 15 may be thicker than the optical distance between nodes Z2 and Z3 located on the both sides of the antinode P3 corresponding to the first current confinement layer 15. However, where the integral value (area) of the standing wave intensity between the nodes Z2 and Z3 is 1.0, the integral value (area A) of the standing wave intensity in the region corresponding to the first current confinement layer 15 is preferably 0.5 or more and smaller than 1.0.

When a layer containing an oxide is located in the position of the antinode of the standing wave, light shuttling in the resonator is scattered by the layer containing the oxide. Therefore, the current confinement region 15a fundamentally has characteristics to give a loss to the light shuttling in the resonator and suppress oscillation. However, as described above, the current confinement region 15a is formed only in the outer edge region of the first current confinement layer 15. Therefore, the current confinement region 15a mainly suppresses oscillation in the transverse mode with the order having a large gain in the region corresponding to the outer edge region of the first current confinement layer 15 (outer edge of the light emitting region 13A) out of the light shuttling in the resonator. That is, the current confinement region 15a hardly suppresses oscillation in the transverse mode with the order having a large gain in the region corresponding to the current injection region 15b (central portion of the light emitting region 13A) out of the light shuttling in the resonator. Thus, for the light in the transverse mode with the latter order, the first current confinement layer 15 is almost transparent.

As described later, the second current confinement layer 17 has a function to confine a current more powerfully than the first current confinement layer 15. Therefore, the diameter size of the current injection region 15b can be set free relatively. When the diameter of the current injection region 15b is adjusted to an appropriate value, it is possible that a loss is hardly given to the light in the basic transverse mode having a large gain in the central portion of the light emitting region 13A, and a loss is selectively given to only the light in the high-order transverse mode having a large gain in the outer edge of the light emitting region 13A. As above, the first current confinement layer 15 has the function to selectively give a loss only to the light in the high-order transverse mode, in addition to the function to confine a current.

In addition, even when the diameter of the current injection region 15b is not excessively narrowed, as described later, the second current confinement layer 17 can suppress the oscillation in the high-order transverse mode as well. Therefore, the diameter of the current injection region 15b can be increased. When the diameter of the current injection region 15b is increased, the area of the light emitting region 13A is increased. Therefore, the resistance of the active layer 13 (junction resistance) is decreased, and the series resistance and the electrical power consumption of the VCSEL can be reduced.

The second current confinement layer 17 has a torus-shaped current confinement region 17a in the outer edge region. The second current confinement layer 17 has a circular current injection region 17b (second current injection region) with the diameter of W2 (for example, 3 to 4 μm) in the central region thereof. W2 is smaller than W1. The current injection region 17b is made of, for example, $Al_{x9}Ga_{1-x9}As$ ($x8<x9\leq1$). The current confinement region 17a contains $Al_2O_3$ (aluminum oxide) obtained by oxidizing high concentrated Al contained in the second current confinement layer 17 from the side surface of the mesa 30. That is, the second current confinement layer 17 has a function to confine a current more powerfully than the first current confinement layer 15.

The second current confinement layer 17 is formed at a region including a node located apart from the antinode in the active layer 13 by $(2n+1)\lambda/4$ (n is an integer number larger than m). For example, as shown in FIGS. 2A and 2B, the second current confinement layer 17 is formed at a region between the first current confinement layer 15 and the p-type DBR layer 18, including node Z4 as the fourth node from the active layer 13 side among the nodes (Z1, Z2, Z3, Z4, Z5 and so on) of the standing wave with the same wavelength as the light emitting wavelength $\lambda$ formed in the resonator.

n is an integer number larger than m. Thereby, the first current confinement layer 15 and the second current confinement layer 17 are arranged not to contact with each other physically. If the first current confinement layer 15 and the second current confinement layer 17 are in contact with each other, a thick oxide layer including the first current confinement layer 15 and the second current confinement layer 17 is formed in the resonator, leading to a possibility of blocking the amplitude function of the resonator. If the amplitude function of the resonator is lost, not only the oscillation in the high-order transverse mode but also the oscillation in the basic transverse mode is suppressed, and thus it becomes difficult to selectively suppress only the high-order transverse mode oscillation. To prevent such a state, it is extremely important that the first current confinement layer 15 and the second current confinement layer 17 are arranged not to contact with each other physically For the optical thickness L2 of the second current confinement layer 17, where the integral value (area) of the standing wave intensities between the nodes Z3 and Z5 on the both sides of the node Z4 corresponding to the second current confinement layer 17 is 1.0, the integral value (area B) of the standing wave intensity in the region corresponding to the second current confinement layer 17 is preferably smaller than 0.1. The optical thickness L2 is preferably equal to or more than the thickness capable of being oxidized.

When a layer containing an oxide is located in the position of the node of the standing wave, the light shuttling in the resonator is not scattered by the layer containing the oxide. The layer containing the oxide is transparent for the light shuttling in the resonator. Therefore, the current confinement region 17a ideally has characteristics not to give a loss to the light shuttling in the resonator and not to suppress oscillation. However, the current confinement region 17a actually has a certain thickness, and occupies portions other than the node of the standing wave. Therefore, a light loss is thereby slightly generated. However, when the optical thickness L2 of the second current confinement layer 17 is equal to or more than the thickness capable of being oxidized, and the integral value (area B) of the standing wave intensity in the region corresponding to the second current confinement layer 17 is the value in the range smaller than 0.1, the light loss due to the current confinement region 17a can be decreased to the degree which can be ignored. As above, the second current confinement layer 17 has characteristics not to give a loss to the light shuttling in the resonator substantially.

Since the current injection region 17b is provided in the central portion of the second current confinement layer 17, the second current confinement layer 17 has a function to confine the current. Thereby, the diameter of the current injection region 17b can be decreased to the degree that the current density becomes almost uniform over the whole area of the current injection region 17b without giving a loss to the light substantially. As above, in the second current confinement layer 17, the diameter size of the current injection region 17b can be set freely relatively. Further, the second current confinement layer 17 is provided in a position farther from the active layer than the first current confinement layer 15. Therefore, when the diameter of the current injection region 17b is set to the size with which the current density becomes almost uniform over the whole area of the current injection region 17b, the current confined by the second current confinement layer 17 is not concentrated on the outer edge of the current injection region 15b of the first current confinement layer 15, and the current is concentrated on the central portion of the current injection region 15b. In the result, it becomes possible to intensively inject the current into the central portion of the region corresponding to the current injection region 15b in the active layer 13 (central portion of the light emitting region 13A). As above, the second current confinement layer 17 not only can confine the current, but also can intensively inject the current into the central portion of the light emitting region 13A.

In view of the function and the characteristics, the second current confinement layer 17 may be provided in the region further from the active layer 13 side than the first current confinement layer 15. For example, the second current confinement layer 17 may be provided in the region of the low-refractive index layer of the p-type DBR layer 18.

The p-type contact layer 19 is made of, for example, p-type GaAs. In the region thereof opposed to the foregoing current injection region 17b, an aperture in the shape of, for example, a circle may be provided.

The p-side electrode 20 is structured by layering, for example, a titanium (Ti) layer, a platinum (Pt) layer, and a gold (Au) layer in this order, and is electrically connected to the p-type contact layer 19. Further, in the p-side electrode 20, an aperture W1 is provided in the region corresponding to the current injection region 17b. The n-side electrode 21 has a structure in which, for example, an alloy layer of gold (Au) and germanium (Ge), a nickel (Ni) layer, and a gold (Au) layer are sequentially layered from the substrate 10 side, and is electrically connected to the substrate 10. The n-side electrode 21 may be formed on the surface exposed around the mesa 30 in the n-type DBR layer 11.

The VCSEL according to this embodiment can be manufactured, for example, as follows.

Figure 3A:
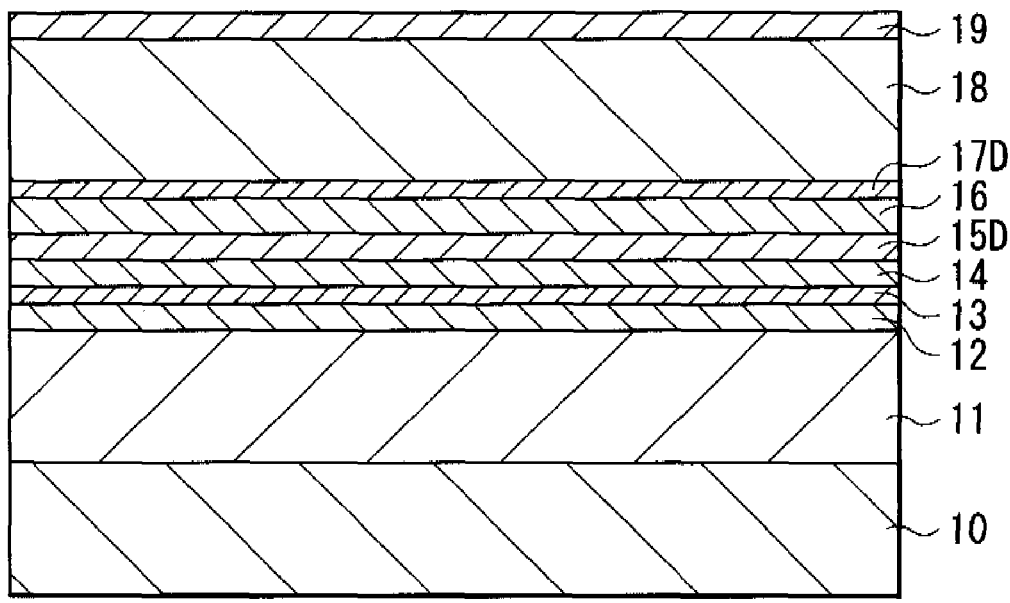
FIGS. 3A and 3B are cross sections for explaining steps of manufacturing the laser.
Figure 3B:
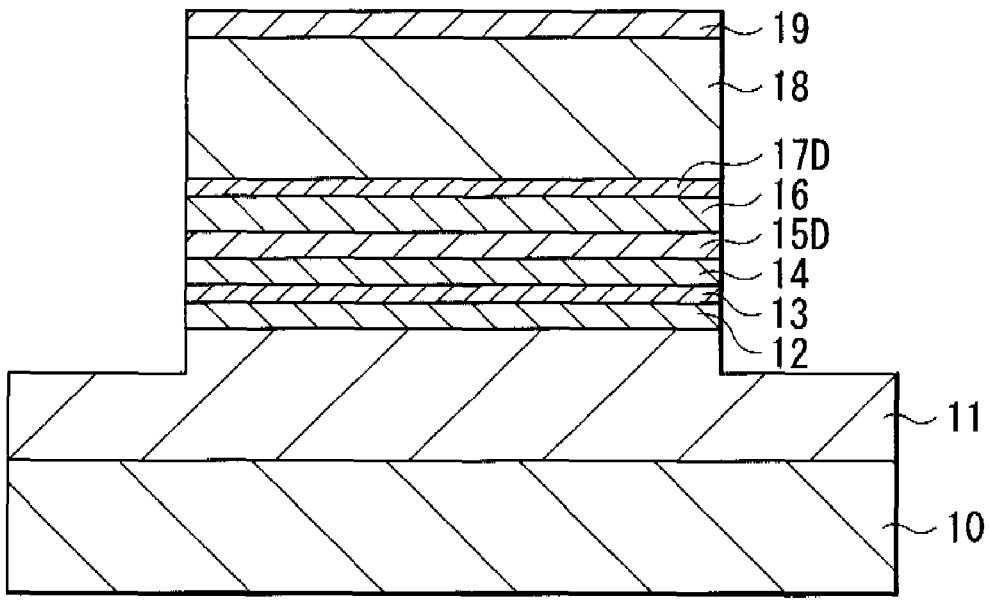
Figure 4:
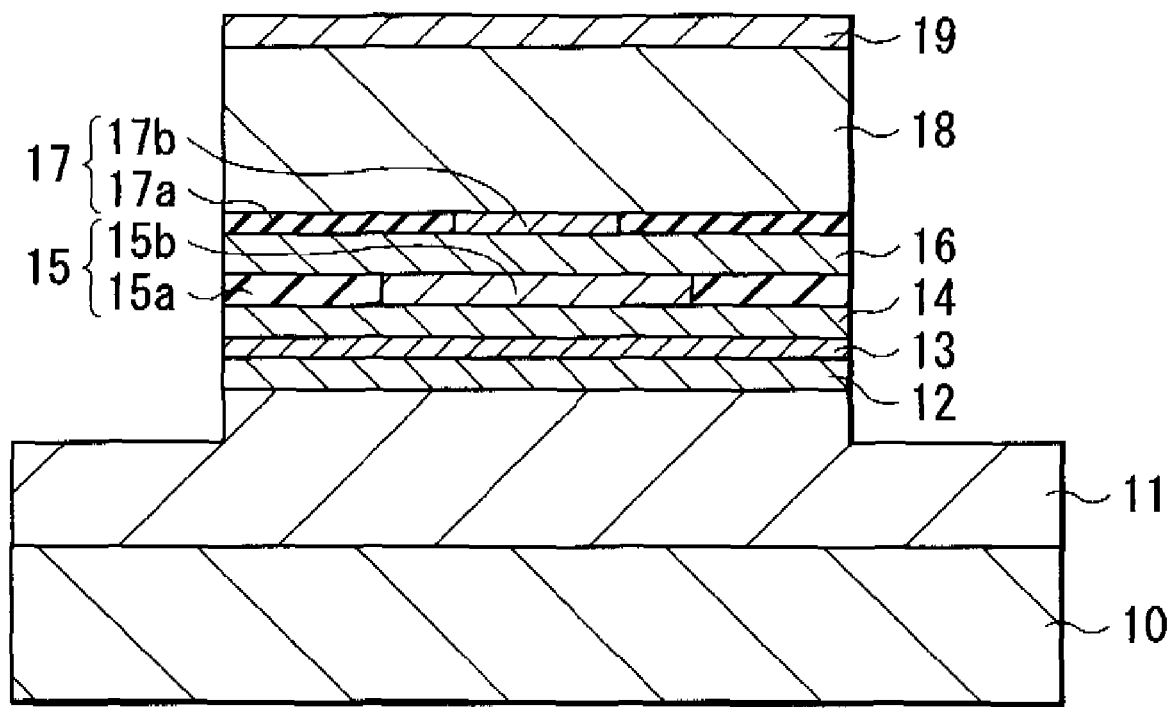
FIG. 4 is a cross section for explaining a step following the step of FIG. 3B.

FIGS. 3A, 3B and 4 show the method of manufacturing the VCSEL in the order of steps. Here, compound semiconductor layers made of GaAs on the substrate 10 are formed by, for example, MOCVD (Metal Organic Chemical Vapor Deposition) method. Then, as a raw material of the GaAs-base compound semiconductor, for example, trimethyl aluminum (TMA), trimethyl gallium (TMG), or arsine ($AsH_3$) is used. As a raw material of a donor impurity, for example, $H_2Se$ is used. As a raw material of an acceptor impurity, for example, dimethyl zinc (DMZ) is used.

First, the n-type DBR layer 11, the n-type guide layer 12, the active layer 13, the p-type guide layer 14, a first current confinement layer 15D, the spacer layer 16, a second current confinement layer 17D, the p-type DBR layer 18, and the p-type contact layer 19 are layered over the substrate 10 in this order. After that, a resist layer R1 is formed on the p-type contact layer 19 (FIG. 3A). The symbol "D" at the end of the first current confinement layer 15D and the second current confinement layer 17D means a state that the layer is not provided with oxidation process and a region containing an oxide such as the current confinement region 15a and the current confinement region 17a is not formed yet.

Next, the region from the p-type contact layer 19 to part of the n-type DBR layer 11 is selectively removed by, for example RIE (Reactive Ion Etching) method to form the mesa 30 (FIG. 3B).

Next, oxidation treatment is performed at a high temperature in the water vapor atmosphere to concurrently oxidize high concentrated Al contained in the first current confinement layer 15D and the second current confinement layer 17D from outside of the mesa 30. Then, the Al concentration (or Al composition ratio) contained in the first current confinement layer 15D and the second current confinement layer 17D is set so that the diameter size at the non-oxidized region in the first current confinement layer 15D and the second current confinement layer 17D becomes respectively a given value when oxidation is made for a given time under the same oxidation conditions. Thus, in oxidation process, it is only necessary to strictly control the oxidation time. Therefore, the first current confinement layer 15 and the second current confinement layer 17 can be easily and precisely formed. By performing oxidation process as above, the outer edge of the first current confinement layer 15D and the second current confinement layer 17D becomes an insulating layer (aluminum oxide), the current confinement regions 15a and 17a are formed in the outer edge thereof, and the central portion thereof becomes the current injection regions 15b and 17b. Thereby, the first current confinement layer 15 and the second current confinement layer 17 are formed (FIG. 4).

Next, the foregoing metal material is layered on the mesa 30 and on the peripheral substrate of the mesa 30 by, for example, vacuum vapor deposition method. After that, for example, by selective etching, the p-side electrode 20 is formed and the aperture W1 is formed in the upper portion of the mesa 30. Subsequently, the rear face of the substrate 10 is polished as appropriate to adjust the thickness thereof. After that, the n-side electrode 21 is formed on the rear face of the substrate 10. Consequently, the VCSEL of this embodiment is manufactured.

In the VCSEL having the foregoing structure, when a given voltage is applied between the n-side electrode 21 and the p-side electrode 20, a current is injected into the active layer 13 through the current injection regions 15b and 17b of the current confinement layers 15 and 17. Thereby, light is emitted due to electron-hole recombination. Such light is reflected by the pair of the n-type DBR layer 11 and the p-type DBR layer 18. Laser oscillation is generated at a wavelength in which the phase change when the light shuttles once in the device becomes an integral multiple of 2 n. Then, the light is emitted outside as a laser beam.

Figure 5:
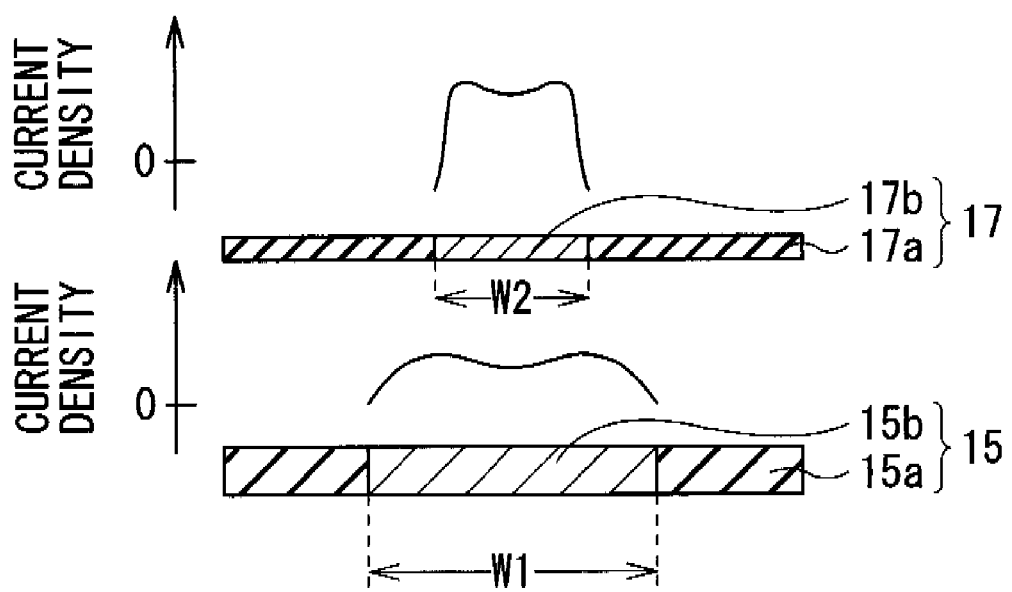
FIG. 5 shows distributions for explaining current densities in the laser of FIG. 1.
Figure 6:
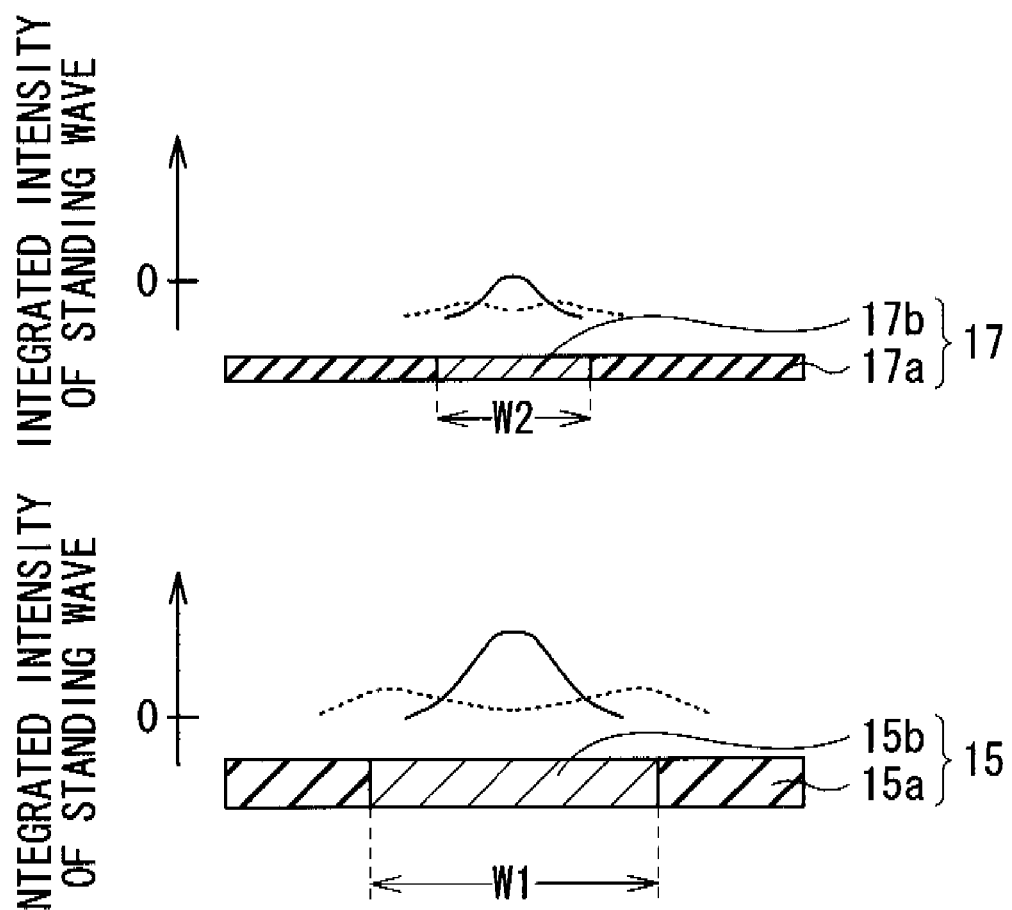
FIG. 6 shows distributions for explaining integrated intensity of a standing wave in the laser of FIG. 1.
Figure 7A:
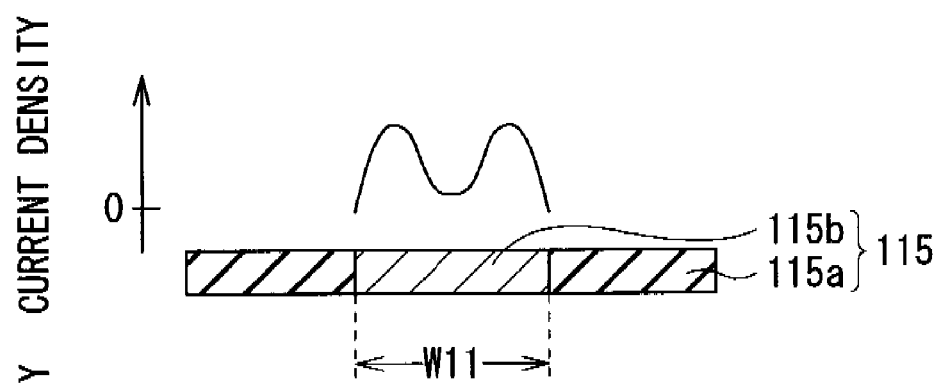
FIGS. 7A and 7B show distributions for explaining current densities in a laser of related art.
Figure 7B:
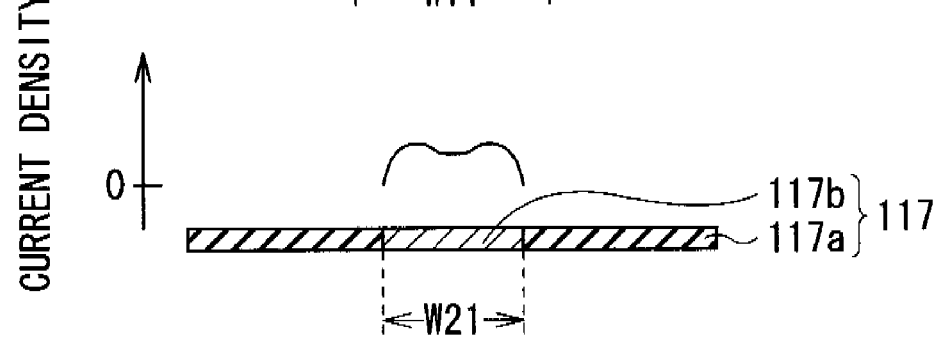
Figure 8A:
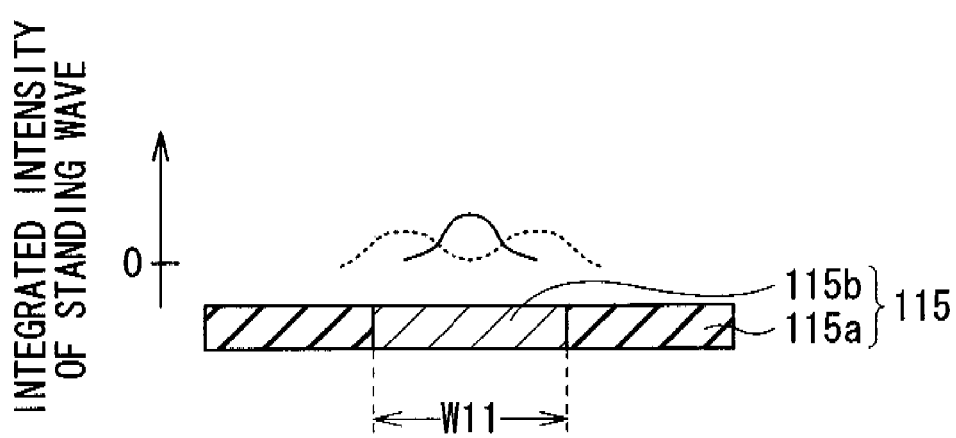
FIGS. 8A and 8B show distributions for explaining integrated intensity of a standing wave in a laser of related art.
Figure 8B:
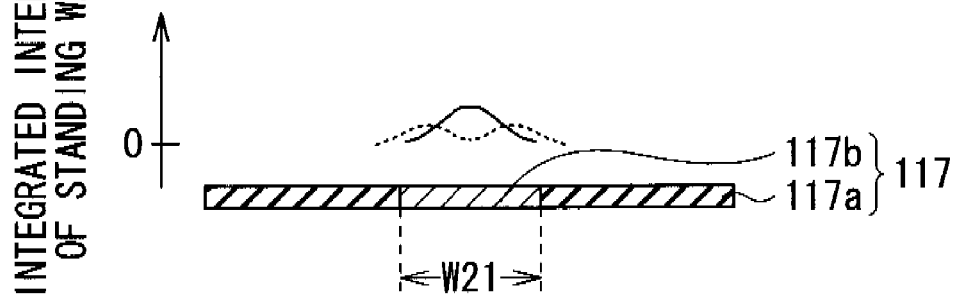

A description will be hereinafter given in detail of the operation and the effects of the VCSEL of this embodiment by comparison with comparative examples. FIG. 7A shows the current density distribution in a current injection region 115b when the second current confinement layer is not provided, and only a first current confinement layer 115 including a current confinement region 115a and the current injection region 115b is provided. FIG. 7B shows the current density distribution in a current injection region 117b when the first current confinement layer is not provided, and only a second current confinement layer 117 including a current confinement region 117a and the current injection region 117b is provided. FIG. 8A shows the distribution of the integrated standing wave intensity in the current injection region 115b when only the first current confinement layer 115 is provided. FIG. 8B shows the distribution of the integrated standing wave intensity in the current injection region 117b when only the second current confinement layer 117 is provided. FIG. 5 shows the distributions of the current density in the current injection regions 15b and 17b of this embodiment. FIG. 6 shows the distributions of the integrated standing wave intensity in the current injection regions 15b and 17b of this embodiment. The first current confinement layer 115 is provided at an antinode of the standing wave and is thick as the first current confinement layer 15 of this embodiment. The second current confinement layer 117 is provided at a node of the standing wave and is thin as the second current confinement layer 17 of this embodiment.

In general, when only the first current confinement layer 115 is provided, it is necessary to suppress oscillation in the high-order transverse mode by only the first current confinement layer 115. Therefore, there is a tendency that a diameter W11 of the current injection region 115b has a lower degree of freedom than the diameter W1 of the current injection region 15b in this embodiment, and the diameter W11 is relatively narrowed (FIG. 7A). As a result, a current is concentrated on the outer edge of the current injection region 115b to accelerate the oscillation in the high-order transverse mode (FIG. 8A).

Meanwhile, when only the second current confinement layer 117 is provided, it is necessary to suppress the oscillation in the high-order transverse mode by only the second current confinement layer 117. However, since the second current confinement layer 117 is provided at the node of the standing wave, it is difficult that the second current confinement layer 117 suppresses the oscillation in the high-order transverse mode by using scattering of light. Thus, it is possible that a diameter W21 of the current injection region 117b is narrowed more than the diameter W11 to obtain a uniform current density distribution in the current injection region 117b (FIG. 7B) and thereby to decrease the oscillation in the high degree lateral mode (FIG. 8B). However, when the diameter W21 is excessively narrowed, not only the resistance value of the second current confinement layer 117 becomes large but also the resistance of the active layer becomes large due to the narrowed area of the light emitting region 13A. Thereby, the series resistance and the electrical power consumption of the VCSEL become increased, and thus it becomes difficult to obtain large light output.

Meanwhile, in this embodiment, when the diameter of the current injection region 17b is narrowed to the degree that the current density becomes almost uniform over the whole area of the current injection region 17b, the current confined by the second current confinement layer 17 is not concentrated on the outer edge of the current injection region 115b as shown in FIG. 7A, and the current is concentrated on the central portion of the current injection region 15b (FIG. 5). As a result, the current can be intensively injected into the central portion of the region corresponding to the current injection region 15b in the active layer 13 (central portion of the light emitting region 13A). Therefore, only the oscillation in the high-order lateral mode having a large gain in the outer edge of the light emitting region 13A can be selectively suppressed.

The thin second current confinement layer 17 is provided at the node of the standing wave. Therefore, a loss is hardly given to light regardless of the diameter size of the current injection region 17b, and oscillation in the basic lateral mode having a large gain in the central portion of the light emitting region 13A is hardly blocked (FIG. 6). Further, as described above, the second current confinement layer 17 has the function to confine a current. Therefore, it is possible to relatively freely set the diameter size of the current injection region 15b of the first current confinement layer 15 provided at the antinode of the standing wave. When the diameter size of the current injection region 15b is appropriately adjusted, it is possible that a loss is hardly given to the light in the basic lateral mode having a large gain in the central portion of the light emitting region 13A, and a loss is selectively given to only the light in the high-order lateral mode having a large gain in the outer edge of the light emitting region 13A (FIG. 6).

Further, the oscillation in the high-order lateral mode can be suppressed by the second current confinement layer 17 as well without excessively narrowing the diameter of the current injection region 15b. Therefore, the diameter of the current injection region 15b can be increased more than in the case when only the first current confinement layer 115 is provided. When the diameter of the current injection region 15b is increased, the area of the light emitting region 13A is increased. Therefore, the resistance of the active layer 13 (junction resistance) is decreased, and the series resistance and the electrical power consumption of the VCSEL can be decreased. As a result, it is possible to improve the light output in the basic lateral mode while suppressing the oscillation in the high-order lateral mode.

Further, as described above, the diameter size of the first and the second current injection regions can be easily adjusted by appropriately adjusting the Al concentration (Al composition ratio) contained in the first current confinement layer and the second current confinement layer.

As above, in the VCSEL of this embodiment, the first current confinement layer and the second current confinement layer are provided. Therefore, the VCSEL of this embodiment can be easily manufactured, and only the oscillation in the high-order lateral mode can be selectively suppressed.

When the first current confinement layer 15 has the optical thickness so that the integral value (area) of the standing wave intensity in the region corresponding to the first current confinement layer 15 is 0.5 or more and smaller than 1.0 where the integral value (area) of the standing wave intensity in the region between two nodes Z2 and Z3 located on the both sides of the antinode of the standing wave corresponding to the first current confinement layer 15 is 1.0, a loss to the light in the basic lateral mode given by the first current confinement layer 15 in the case that the diameter of the current injection region 15b is a certain level can be extremely small. When the second current confinement layer 17 has the optical thickness which is equal to or more than the thickness capable of being oxidized, so that the integral value (area) of the standing wave intensity in the region corresponding to the second current confinement layer 17 is smaller than 0.1 where the integral value (area) of the standing wave intensity in the region between two nodes Z3 and Z5 located on the both sides of the node of the standing wave corresponding to the second current confinement layer 17 is 1.0, a light loss in the second current confinement layer 17 can be extremely small. Therefore, the optical thicknesses of the first current confinement layer 15 and the second current confinement layer 17 are set as above, it is possible to further improve the light output in the basic lateral mode while suppressing the oscillation in the high-order lateral mode.

Descriptions have been hereinbefore given of the invention with reference to the embodiment. However, the invention is not limited to the foregoing embodiment, and various modifications may be made.

For example, in the foregoing embodiment, the active layer 13 is provided at a region including the antinode of the standing wave formed in the resonator. However, the active layer 13 may be formed in a region including a node of the standing wave. In this case, the first current confinement layer 15 is formed at a region including an antinode located apart from the node in the active layer 13 by $(2m-1)\lambda/4$ (m is an integer number of 1 or more, and $\lambda$ is the resonance wavelength), and the second current confinement layer 17 is formed at a region including a node located apart from the antinode in the active layer 13 by $n\lambda/2$ (n is an integer number larger than m). The reason thereof is derived from the reason similar to that in the case where the active layer 13 is formed at the region including the antinode of the standing wave formed in the resonator.

Further, in the foregoing embodiment, the invention has been described with reference to the GaAs-base compound semiconductor laser. However, the invention can be also applied to other compound semiconductor lasers such as a GaInP-base compound semiconductor laser, an AlGaInP-base compound semiconductor laser, an InGaAs-base compound semiconductor laser, a GaInP-base compound semiconductor laser, an InP-base compound semiconductor laser, a GaN-base compound semiconductor laser, a GaInN-base compound semiconductor laser, and a GaInNAs-base compound semiconductor laser.

It should be understood by those skilled in the art that various modifications, combinations, sub-combinations and alternations may occur depending on design requirements and other factors insofar as they are or the equivalents thereof.

What is claimed is:

1. A vertical cavity surface emitting laser comprising the following stacked in a vertical direction:

a resonator including an active layer having a light emitting region and a first multilayer reflector and a second multilayer reflector provided with the active layer in between the first and second multilayer reflectors, the resonator resonating at a given wavelength;

a first layer having a torus-shaped first current confinement portion in an outer region of the first layer and a circular first current injection portion in an inner portion of the first layer corresponding to the light emitting region, the first current confinement portion positioned between the active layer and the first multilayer reflector, the first current confinement portion including an antinode of a standing wave formed in the resonator, the first current injection portion made of a first material;

a second layer having a torus-shaped second current confinement portion in an outer region of the first layer and a circular second current injection portion in an inner portion of the second layer corresponding to the light emitting region, the second current injection portion having a diameter smaller than a diameter of the first current injection portion, the second current confinement portion being positioned between the first current confinement portion and the first multilayer reflector, the second current confinement portion including a node of the standing wave formed in the resonator, the second current injection portion made of a second material that is different than the first material of the first current injection portion; and at least one layer spacing said first layer from said second layer, and completely separating said first layer from said second layer in their entireties, wherein, the first current confinement portion selectively suppresses high-order transverse mode oscillation; and a thickness of the second current confinement portion relative to the vertical direction is thinner than the thickness of the first current confinement portion.

2. The vertical cavity surface emitting laser according to claim 1, wherein the first current confinement portion has a thickness relative to the vertical direction so that an integral value (area) of a standing wave intensity in a region of the standing wave encompassed by the first current confinement portion is 0.5 or more and smaller than 1.0 where an integral value (area) of a standing wave intensity in a region of the standing wave extending between and including two nodes located immediately on the both sides of the antinode of the standing wave included in the first current confinement portion is 1.0, and the second current confinement portion has a thickness so that an integral value (area) of a standing wave intensity in a region of the standing wave encompassed by the second current confinement portion is smaller than 0.1 where an integral value (area) of a standing wave intensity in a region of the standing wave extending between and including two nodes located immediately on the both sides of the node of the standing wave included in the second current confinement portion is 1.0.

3. The vertical cavity surface emitting laser according to claim 1, wherein the active layer is positioned at a region including an antinode of the standing wave formed in the resonator, the first current confinement portion is formed at a region including an antinode located apart from the antinode in the active layer by $m\lambda/2$ (m is an integer number larger than 1, and $\lambda$ is a resonance wavelength), and the second current confinement portion is positioned at a region including a node located apart from the antinode in the active layer by $(2n+1)\lambda/4$ (n is an integer number larger than m).

4. The vertical cavity surface emitting laser according to claim 1, wherein the active layer is positioned at a region including a node of the standing wave formed in the resonator,
the first current confinement portion is positioned at a region including an antinode located apart from the node in the active layer by $(2m-1)\lambda/4$ (m is an integer number of 1 or more, and $\lambda$ is a resonance wavelength), and
the second current confinement portion is positioned at a region including a node located apart from an antinode in the active layer by $n\lambda/2$ (n is an integer number larger than m).

5. The vertical cavity surface emitting laser according to claim 1, wherein the at least one layer is made of p-type $Al_{x5}Ga_{1-x5}As$ ($0<x5<1$).

6. The vertical cavity surface emitting laser according to claim 1, further comprising:
an electrode on a side of the second confinement portion opposite to the first confinement portion,
wherein the electrode has an aperture therein with a diameter equal to the diameter of the second current injection portion.

7. The vertical cavity surface emitting laser according to claim 6, wherein the diameter of the aperture is 4 to 6 µm.

8. The vertical cavity surface emitting laser according to claim 1,
wherein
the first material of the first current injection portion is $Al_{x8}Ga_{1-x8}As$, and
$x8<1$.

9. The vertical cavity surface emitting laser according to claim 8,
wherein
the second material of the second current injection portion is $Al_{x9}Ga_{1-x9}As$, and
$x8<x9\leq1$.

10. The vertical cavity surface emitting laser according to claim 1, wherein the first current injection portion has a thickness equal to a thickness of the first current confinement portion.

11. The vertical cavity surface emitting laser according to claim 1, wherein the second current injection portion has a thickness equal to a thickness of the second current confinement portion.

* * * * *